(12) United States Patent
Nangalia et al.

(10) Patent No.: US 8,552,557 B1
(45) Date of Patent: Oct. 8, 2013

(54) ELECTRONIC COMPONENT PACKAGE FABRICATION METHOD AND STRUCTURE

(75) Inventors: Sundeep Nand Nangalia, Raleigh, NC (US); Richard Raymond Green, Durham, NC (US); Robert Lanzone, Chandler, AZ (US); Ravi Kiran Chilukuri, Cary, NC (US); Rex Beach Anderson, III, Raleigh, NC (US)

(73) Assignee: Amkor Technology, Inc., Chandler, AZ (US)

( * ) Notice: Subject to any disclaimer, the term of this patent is extended or adjusted under 35 U.S.C. 154(b) by 55 days.

(21) Appl. No.: 13/327,440

(22) Filed: Dec. 15, 2011

(51) Int. Cl.
*H01L 23/48* (2006.01)
*H01L 21/4763* (2006.01)
*H01L 21/44* (2006.01)

(52) U.S. Cl.
USPC ............ 257/738; 257/737; 438/625; 438/666

(58) Field of Classification Search
USPC .......................... 257/734–786; 438/597–688
See application file for complete search history.

(56) References Cited

U.S. PATENT DOCUMENTS

| | | | |
|---|---|---|---|
| 5,464,794 A * | 11/1995 | Lur et al. ...................... | 438/640 |
| 6,410,414 B1 | 6/2002 | Lee | |
| 6,455,408 B1 | 9/2002 | Hwang et al. | |
| 6,620,633 B2 | 9/2003 | Hembree et al. | |
| 6,835,595 B1 | 12/2004 | Suzuki et al. | |
| 7,023,088 B2 | 4/2006 | Suzuki et al. | |
| 7,157,363 B2 | 1/2007 | Suzuki et al. | |
| 7,183,645 B2 | 2/2007 | Kurosawa et al. | |
| 7,205,660 B2 | 4/2007 | Park et al. | |
| 7,435,781 B2 * | 10/2008 | Dharmarajan et al. ....... | 525/240 |
| 8,058,726 B1 | 11/2011 | Jin et al. | |
| 2001/0025414 A1 * | 10/2001 | Toyoshima et al. ............. | 29/852 |
| 2002/0076913 A1 | 6/2002 | Lee | |
| 2003/0062336 A1 * | 4/2003 | Restaino et al. ................ | 216/57 |
| 2003/0214038 A1 | 11/2003 | Nemoto | |
| 2006/0038291 A1 | 2/2006 | Chung et al. | |
| 2007/0176290 A1 | 8/2007 | Park et al. | |
| 2007/0252275 A1 * | 11/2007 | Huang et al. ................... | 257/737 |
| 2007/0290300 A1 * | 12/2007 | Kawakami ..................... | 257/621 |
| 2008/0012124 A1 | 1/2008 | Stapleton et al. | |

(Continued)

FOREIGN PATENT DOCUMENTS

JP 2008-218629 9/2008

OTHER PUBLICATIONS

Jin et al., "Semiconductor Device and Manufacturing Method Thereof," U.S. Appl. No. 13/274,877, filed Oct. 17, 2011.

(Continued)

*Primary Examiner* — Fernando L Toledo
*Assistant Examiner* — Karen Kusumakar
(74) *Attorney, Agent, or Firm* — McKay and Hodgson, LLP; Serge J. Hodgson

(57) ABSTRACT

An electronic component package includes a RDL pattern comprising a redistribution pattern terminal. A buildup dielectric layer is formed on the RDL pattern, the buildup dielectric layer having a redistribution pattern terminal aperture exposing the redistribution pattern terminal. An interconnection ball is formed within the redistribution pattern terminal aperture and on the redistribution pattern terminal. The interconnection ball includes an enclosed portion having an outer concave surface within the buildup dielectric layer. The angle of intersection between the outer concave surface of the interconnection ball and the redistribution pattern is less than 90°. This minimizes stress between the interconnection ball and the redistribution pattern which, in turn, minimizes failure of the bond between the interconnection ball and the redistribution pattern.

27 Claims, 5 Drawing Sheets

(56) References Cited

U.S. PATENT DOCUMENTS

| | | | |
|---|---|---|---|
| 2009/0166859 A1* | 7/2009 | Yuan et al. | 257/737 |
| 2010/0075493 A1* | 3/2010 | Ishikawa et al. | 438/613 |
| 2011/0204528 A1* | 8/2011 | Matsutani et al. | 257/787 |
| 2011/0229822 A1* | 9/2011 | Stapleton | 430/315 |
| 2013/0062761 A1* | 3/2013 | Lin et al. | 257/738 |
| 2013/0187269 A1* | 7/2013 | Lin et al. | 257/737 |

OTHER PUBLICATIONS

Anderson et al., "Advances in WLCSP Technologies for Growing Market Needs," Proceedings of SMTA's 6th Annual International Wafer Level Packaging Conference, Oct. 27-30, 2009, 6 pages, Santa Clara, CA.

Stapleton et al., "Reliability of 400 um Pitch WLCSP Assemblies with Solder Supporting Material," IWLPC Conference Proceedings, Oct. 30, 2009, pp. 168-171.

Stapleton, "Wafer Level Packaging: A Materials Roadmap," IMAPS Chandler, Aug. 2009, 21 pages.

No author provided, "Fujikura Wafer Level Chip Sized Package (WLCSP) Design Guide", May 16, 2001, Rev. 1.4e, 14 pages.

No author provided, "Wafer-Applied Underfill, LORD Scientist Featured by IMAPS," LORD Corporation News Center, 1 page [online], Retrieved on Nov. 3, 2011 from the Internet: <URL:http://www.lord.com/news-center/news-stories/wafer-applied-underfill-lord-scientist-featuredby-imaps.xml>.

No author provided, "LORD Corporation's Stapleton to Speak at International Wafer-Level Packaging Conference," LORD Corporation News Center, 1 page [online], Retrieved on Nov. 3, 2011 from the Internet: <URL:http://www.lord.com/news-center/press-releases/lord-corporationsstapleton-to-speak-at-international-wafer-level-packaging-conference.xml>.

Nangalia et al., "Electronic Component Package Fabrication Method and Structure," U.S. Appl. No. 13/447,650, filed Apr. 16, 2012.

Nangalia et al., "Electronic Component Package Fabrication Method and Structure," U.S. Appl. No. 13/765,388, filed Feb. 12, 2013.

* cited by examiner

Electronic component package fabrication method 100

ELECTRONIC COMPONENT PACKAGE FABRICATION METHOD AND STRUCTURE

TECHNICAL FIELD

The present application relates to the field of electronics, and more particularly, to methods of forming electronic component packages and related structures.

BACKGROUND

In a typical Wafer Level Chip Scale Package (WLCSP), the pattern of bond pads on the active surface of an electronic component are redistributed to a pattern of interconnection balls, sometimes called solder balls or a Ball Grid Array (BGA), for electrical connection to other structures. This redistribution involves the formation of a circuit pattern and a plurality of dielectric layers on the active surface of the electronic component.

The interconnection balls are bonded to the circuit pattern. However, failure of the bond between the circuit pattern and the interconnection balls results in failure of the WLCSP. Accordingly, it is desirable to form a robust bond between the interconnection balls and the circuit pattern.

BRIEF DESCRIPTION OF THE DRAWINGS

In the following description, the same or similar elements are labeled with the same or similar reference numbers.

DETAILED DESCRIPTION

Figure 4:
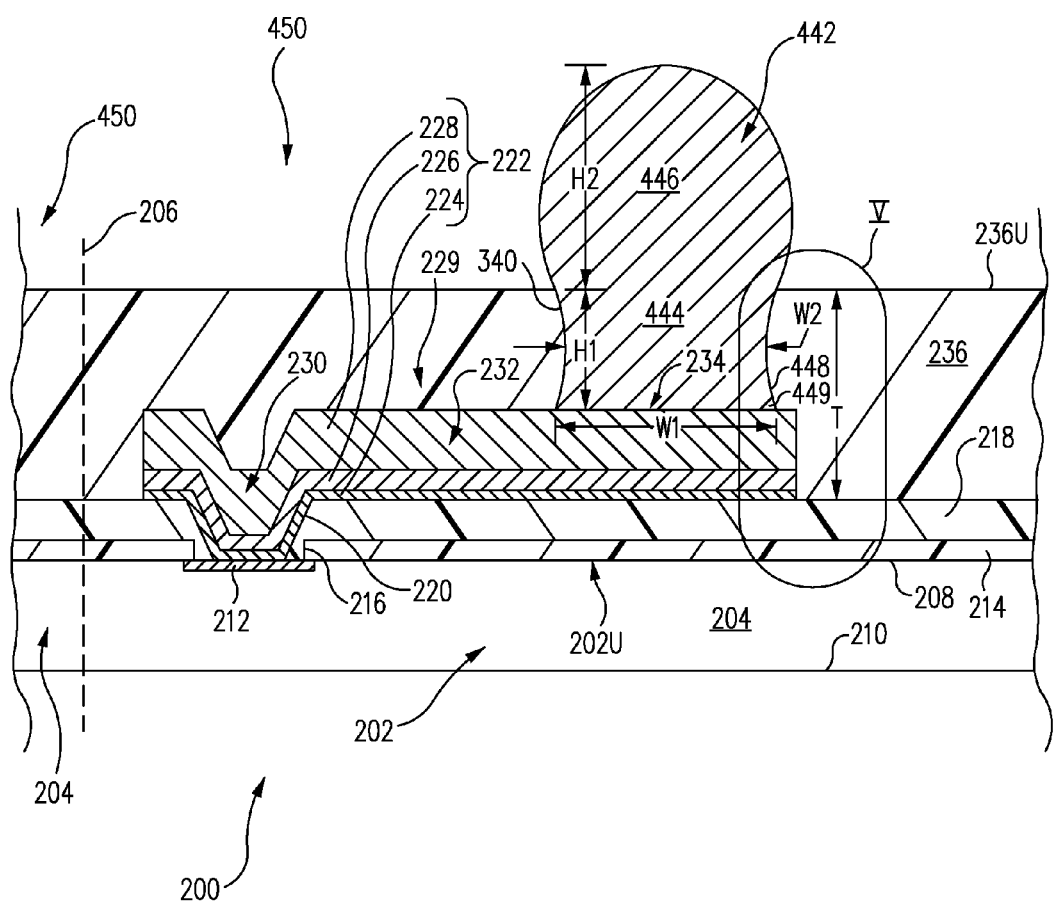
FIG. 4 is a cross-sectional view of the assembly of FIG. 3 at a later stage during fabrication in accordance with one embodiment.
Figure 5:
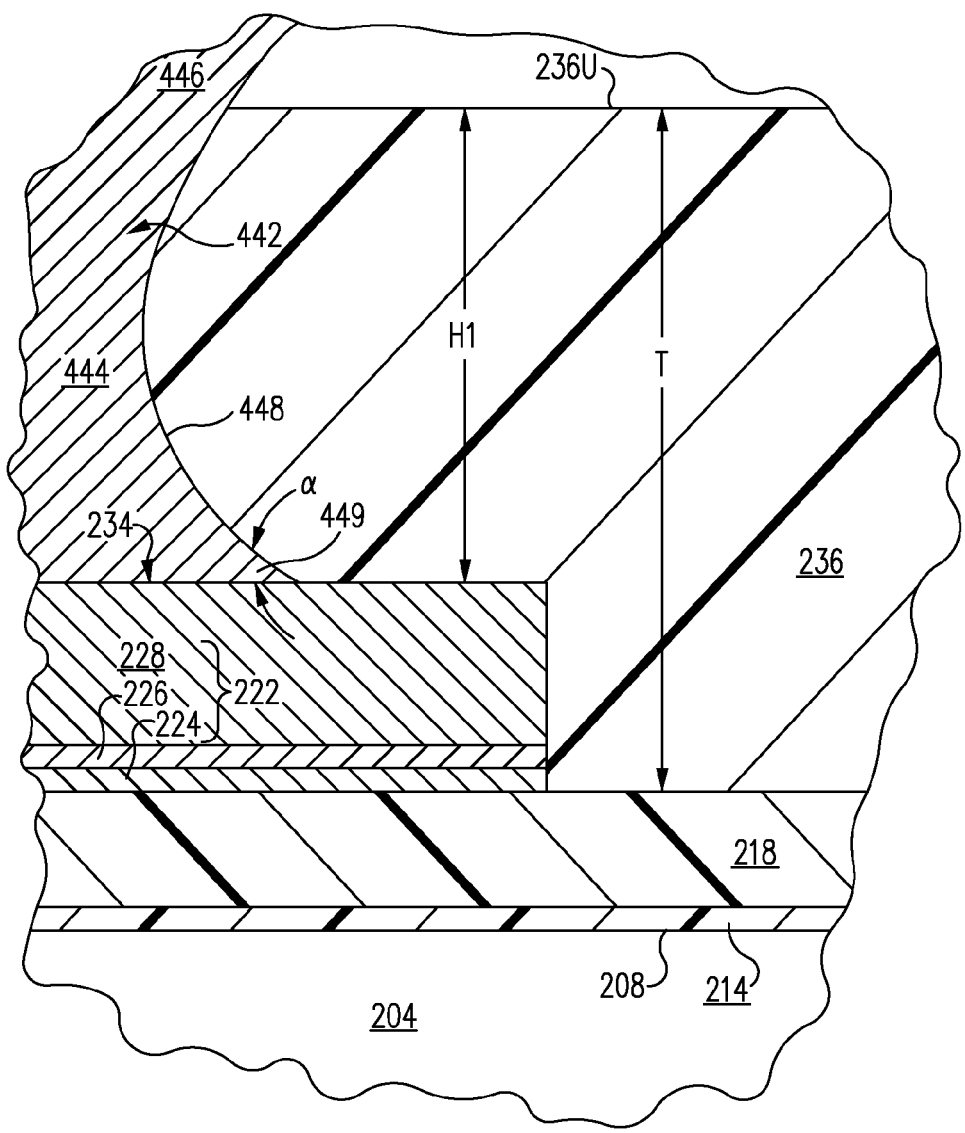
FIG. 5 is an enlarged cross-sectional view of the region V of the assembly of FIG. 4 in accordance with one embodiment.

As an overview and in accordance with one embodiment, referring to FIGS. 4 and 5 together, an electronic component package 450 includes a ReDistribution line (RDL) pattern 222 comprising a redistribution pattern terminal 234. A second buildup dielectric layer 236 is formed on RDL pattern 222, second buildup dielectric layer 236 comprising a redistribution pattern terminal aperture 340 exposing redistribution pattern terminal 234. An interconnection ball 442 is formed within redistribution pattern terminal aperture 340 and on redistribution pattern terminal 234.

Interconnection ball 442 includes an enclosed portion 444 having an outer concave surface 448 within second buildup dielectric layer 236. The angle α of intersection between outer concave surface 448 of interconnection ball 442 and redistribution pattern 222 is less than 90° such that enclosed portion 444 has outwardly protruding lip 449 at redistribution pattern 222. This minimizes stress between interconnection ball 442 and redistribution pattern 222 which, in turn, minimizes failure of the bond between interconnection ball 442 and redistribution pattern 222. In this manner, reliability in the bond between interconnection ball 442 and redistribution pattern 222 is maximized.

Figure 1:
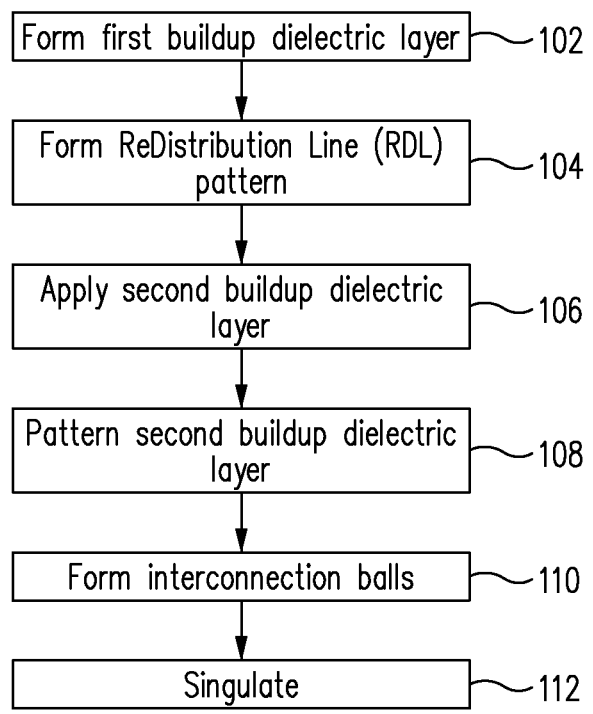
FIG. 1 is a block diagram of an electronic component package fabrication method in accordance with one embodiment.
Figure 2:
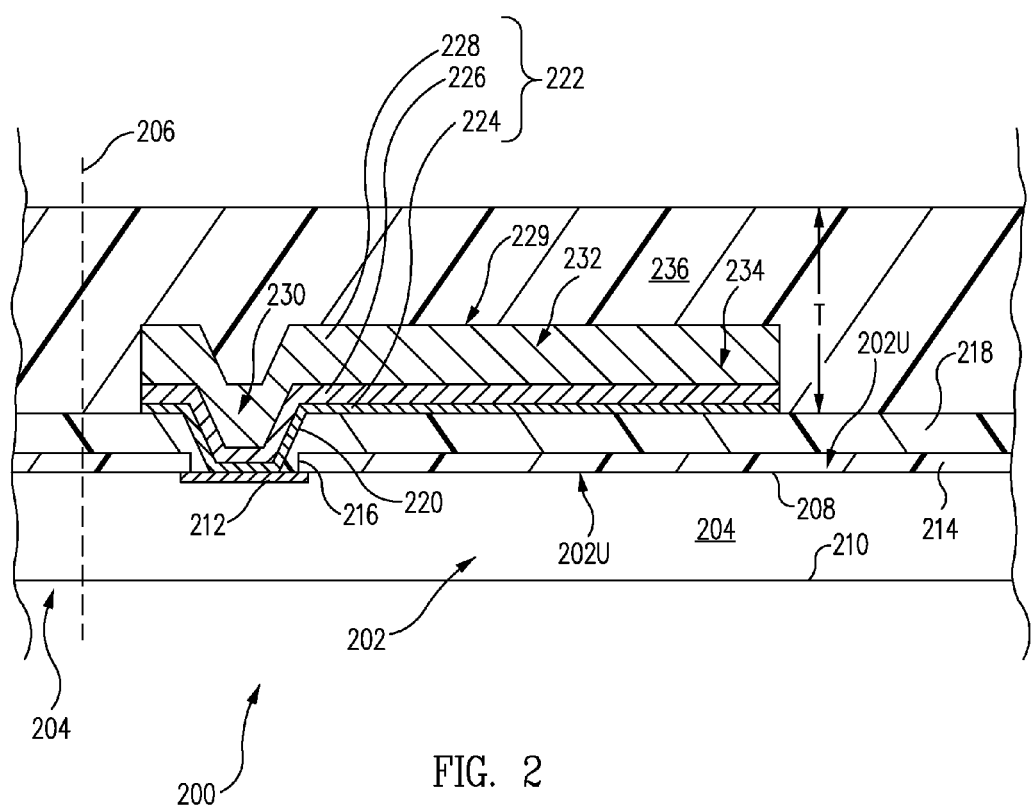
FIG. 2 is a cross-sectional view of an assembly including a wafer in accordance with one embodiment.

Now in more detail, FIG. 1 is a block diagram of an electronic component package fabrication method 100 in accordance with one embodiment. FIG. 2 is a cross-sectional view of an assembly 200 including a wafer 202 in accordance with one embodiment.

Referring now to FIGS. 1 and 2 together, wafer 202, sometimes called a substrate, e.g., a silicon wafer, includes a plurality of electronic components 204 integrally connected together. Electronic components 204 are delineated from one another by singulation streets 206.

In one embodiment, electronic components 204 are integrated circuit chips, e.g., active components. However, in other embodiments, electronic components 204 are passive components such as capacitors, resistors, or inductors.

In accordance with this embodiment, electronic components 204 include active surfaces 208 and opposite inactive surfaces 210. Electronic components 204 further include bond pads 212 formed on active surfaces 208. Although only a single bond pad 212 is illustrated in the figures, in light of this disclosure, those of skill in the art will understand that each electronic component 204 includes a plurality of bond pads 204 which are redistributed to a pattern of interconnection balls as discussed below.

Bond pads 212, e.g., copper or aluminum pads, form the input/output (I/O) terminals for electronic components 204. Bond pads 212 are the finished and outermost I/O terminals for electronic components 204 in their final form as would be provided from the manufacturer of electronic components 204. Stated another way, bond pads 212 are the I/O terminals of wafer 202 as finished from the wafer manufacturer.

In accordance with one embodiment, bond pads 212 are distributed in an edge array. More particularly, bond pads 212 are distributed upon active surfaces 208 adjacent singulation streets 206. In another embodiments, bond pads 212 are distributed in an area array, i.e., are distributed in an array throughout active surfaces 208 including the central regions of active surfaces 208.

In one embodiment, active surface 208 includes a dielectric passivation layer 214 thereon as wafer 202 is finished from the wafer manufacturer. Passivation layer 214 has passivation layer bond pad apertures 216 that expose bond pads 212.

In form first buildup dielectric layer operation 102, a first buildup dielectric layer 218 is formed on active surfaces 208 of electronic components 204 and more specifically on passivation layer 214.

In one embodiment, a dielectric material is applied to passivation layer 214. More generally, a dielectric material is applied to active surfaces 208 of electronic components 204 and even more generally to an active, e.g., first, surface 202U of wafer 202. The dielectric material fills passivation layer bond pad openings 216 in passivation layer 214.

In one embodiment, the dielectric material is polyimide (PI) or polybenzoxazole (PBO) that is applied using a spin on process. Further, the thickness of the dielectric material is 5 μm in one embodiment.

The dielectric material is then patterned to form first buildup dielectric layer bond pad apertures 220 therein. Each first buildup dielectric layer bond pad aperture 220 extends entirely through first buildup dielectric layer 218 and through passivation layer 214, i.e., through a passivation layer bond pad opening 216, to a respective bond pad 212. Accordingly, bond pads 212 are exposed through first buildup dielectric layer bond pad apertures 220.

As illustrated in FIG. 1, passivation layer 214 and first buildup dielectric layer 218 slightly overlap and cover the outer peripheries of bond pads 212 such that the central regions on bond pads 212 are exposed through first buildup dielectric layer bond pad openings 220.

Although passivation layer 214 and first buildup dielectric layer 218 are illustrated in the figures, in another embodiment, passivation layer 214 is not formed. In accordance with this embodiment, first buildup dielectric layer 218 is formed directly on active surfaces 208 of electronic components 214.

From form first buildup dielectric layer operation 102, flow moves to a form ReDistribution Line (RDL) pattern operation 104. In form RDL pattern operation 104, a redistribution pattern 222, sometimes called an RDL pattern 222, is formed.

Redistribution pattern 222 is formed on first buildup dielectric layer 218. Redistribution pattern 222 is electrically connected to bond pads 212 through first buildup dielectric layer openings 220. First buildup dielectric layer 218 electrically isolates redistribution pattern 222 from active surface 208.

In accordance with this embodiment, redistribution pattern 222 includes a tri-layer structure comprising a first redistribution layer 224, a second redistribution layer 226, and a third redistribution layer 228. First redistribution layer 224, e.g., a seed layer, is formed on first buildup dielectric layer 218 and on bond pads 212. Second redistribution layer 226 is formed on first redistribution layer 224, and third redistribution layer 228 is formed on second redistribution layer 226.

In one embodiment, first redistribution layer 224 is titanium tungsten (TiW) or titanium (Ti), second redistribution layer 226 is copper, and third redistribution layer 228 is copper. Illustratively, first redistribution layer 224 and second redistribution layer 226 are seed layers, e.g., that are formed by sputtering. The collective thickness of first redistribution layer 224 and second redistribution layer 226, e.g., the seed layer, is 0.3 μm. The thickness of third redistribution layer 228 is 9 μm±1 μm. In one embodiment, the thickness of the entire redistribution pattern 222 is uniform.

In one embodiment, to form redistribution pattern 222, first redistribution layer 224 and second redistribution layer 226 are blanket deposited, e.g., sputtered. A patterned resist is formed on second redistribution layer 226. Third redistribution layer 228 is selectively plated on second redistribution layer 226 using the patterned resist as a mask. The resist is removed. The exposed unplated portions of first redistribution layer 224 and second redistribution layer 226 are then removed. However, in other embodiments, redistribution pattern 222 is formed using other techniques.

Although particular thicknesses and materials for first, second, and third redistribution layers 224, 226, 228 are set forth, in light of this disclosure, those of skill in the art will understand that first, second, and third redistribution layers 224, 226, 228 have other thicknesses and/or are formed of other materials in other embodiments. Further, although redistribution pattern 222 is illustrated and discussed as including first, second, and third redistribution layers 224, 226, 228, in other embodiments, redistribution pattern 222 includes one or more layers.

Redistribution pattern 222 includes a pattern of electrically conductive signal lines 229. Signal lines 229 include bond pad vias 230, traces 232, and redistribution pattern terminal 234. Although only a single signal line 229 is illustrated, in light of this disclosure, those of skill in the art will understand that redistribution pattern 222 includes a plurality of signal lines 229 depending upon the particular input/output and redistribution desired.

Bond pad vias 230 are within and extend through first buildup dielectric layer bond pad apertures 220 to contact and be electrically connected to bond pads 212.

Traces 232 are typically long thin electrical conductors having a length much greater than a width. Each trace 232 is electrically connected to a respective bond pad via 230 and thus to a respective bond pad 212 at a first end of the trace 232.

In accordance with this embodiment, each trace 232 terminates (ends) in a redistribution pattern terminal 234. Accordingly, the pattern of bond pads 212 is redistributed to the pattern of redistribution pattern terminals 234 by redistribution pattern 222.

From form RDL pattern operation 104, flow moves to an apply second buildup dielectric layer operation 106. In apply second buildup dielectric layer operation 106, a second buildup dielectric 236 is applied.

Second buildup dielectric layer 236 is applied to redistribution pattern 222 and the exposed surface of first buildup dielectric layer 218.

Second buildup dielectric layer 236 is a dielectric material. In one particular embodiment, second buildup dielectric layer 236 has the properties as listed in Table 1.

TABLE 1

| | |
|---|---|
| Tensile strength | 38.9 MPa |
| Modulus | 6.0 GPa (25° C.) |
| | 720 MPa (250° C.) |
| Elongation | 100% |
| Residual Stress | 24 MPa |
| Coefficient of Thermal Expansion (CTE) | 15 ppm (25° C.) |
| | 29 ppm (240° C.) |
| Glass Transition Temperature (Tg) | 120° C. |
| 1% Weight Loss Temperature | 360° C. |
| 5% Weight Loss Temperature | 410° C. |
| Volume Resistivity | >1.0 × E15 |
| Dielectric Constant | 3.5 |
| Dissipation Factor | 0.032 (@ 1 GHz) |
| Breakdown Voltage | 335 V/μm |
| Cure Temperature | 150-200° C. |
| Moisture Update | <1.0% |

In one embodiment, the elongation is the percentage that second buildup dielectric layer 236 stretches before second buildup dielectric layer 236 breaks. For a 100% elongation as listed in Table 1, second buildup dielectric layer 236 stretches to double its length before second buildup dielectric layer 236 breaks.

Further, the cure temperature is the temperature at which second buildup dielectric layer 236 cures. For a cure temperature of 150-200° C. as listed in Table 1, second buildup dielectric layer 236 cures at a temperature in the range of 150-200° C.

In one particular embodiment, second buildup dielectric layer 236 includes 70% inorganic filler, e.g., silica, and 30% binder, e.g., epoxy, although includes other components in other embodiments. A suitable material for second buildup dielectric layer 236 includes the Solderbrace™ material manufactured by the Lord Corporation headquartered in Cary, N.C.

In one embodiment, second buildup dielectric layer 236 is blanket applied by screen printing on the entire active surface 202U of wafer 202, and more particularly, on to redistribution pattern 222 and the exposed surface of first buildup dielectric layer 218.

In one particular embodiment, the thickness T of second buildup dielectric layer 236 as measured from first buildup dielectric layer 218 is within the range of 15 microns (μm) to 40 μm, and suitable is 20 μm.

To illustrate, a 20 μm thick second buildup dielectric layer 236 is applied by printing. Second buildup dielectric layer 236 is subjected to a relaxation time of 10 or more minutes after printing followed by a soft bake at 95° C. for 5 minutes.

Figure 3:
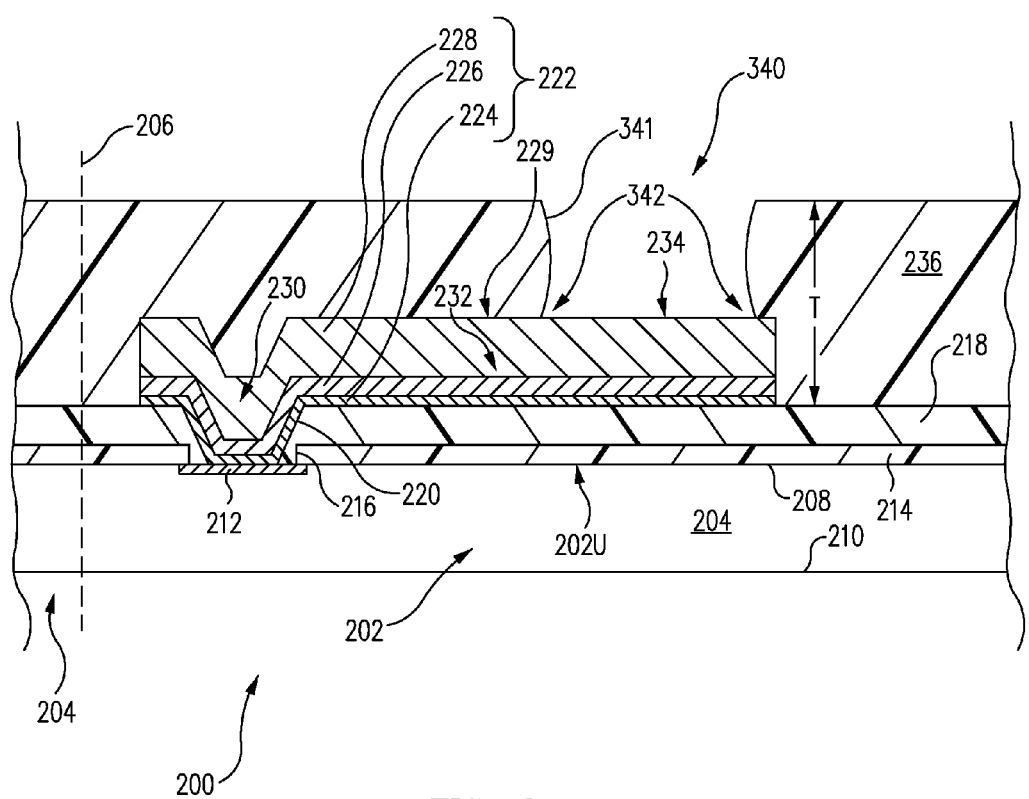
FIG. 3 is a cross-sectional view of the assembly of FIG. 2 at a later stage during fabrication in accordance with one embodiment.

FIG. 3 is a cross-sectional view of assembly 200 of FIG. 2 at a later stage during fabrication in accordance with one embodiment. Referring now to FIGS. 1 and 3 together, from apply second buildup dielectric layer operation 106, flow moves to a pattern second buildup dielectric layer operation 108. In pattern second buildup dielectric layer operation 108, second buildup dielectric layer 236 is patterned to form redistribution pattern terminal apertures 340 therein.

Each redistribution pattern terminal aperture 340 extends entirely through second buildup dielectric layer 236 to a respective redistribution pattern terminal 234 of redistribution pattern 222. Accordingly, redistribution pattern terminals 234 are exposed through redistribution pattern terminal apertures 340.

In one embodiment, to pattern second buildup dielectric layer 236, a mask is applied to second buildup dielectric layer 236 over the regions of second buildup dielectric layer 236 to be removed, e.g., above redistribution terminals 234. Second buildup dielectric layer 236 is Ultra Violet (UV) light exposed through the mask, e.g., at 1300 mj and a 50 μm proximity. The regions of second buildup dielectric layer 236 exposed to the UV light are polymerized, while the unexposed regions, i.e., the regions above redistribution pattern terminals 234, remain unpolymerized. The mask is then removed.

After being exposed to the UV light, second buildup dielectric layer 236 is subjected to a post expose bake at 95° C. for 5 minutes. Second buildup dielectric layer 236 is then subjected to a 45 to 60 second high pressure spray of a second buildup dielectric layer removal fluid, e.g., Propylene Glycol Methyl Ether Acetate (PGMEA), hereinafter referred to as a high pressure PGMEA spray, to form redistribution pattern terminal apertures 340. This is followed by a 45 second dry with nitrogen (N2). In one embodiment, second buildup dielectric layer 236 is rinsed with isopropyl alcohol (IPA) for 30 seconds after the high pressure PGMEA spray.

In one embodiment, the 45 to 60 second PGMEA spray is performed using a high pressure spray developer, i.e., equipment that sprays the PGMEA at high pressure. In one embodiment, the PGMEA is sprayed in the range of 100 pounds per square inch (PSI) to 1000 PSI, and suitably at 300 PSI.

As second buildup dielectric layer 236 includes a high percentage of inorganic filler, e.g., 70% silica, which is relatively difficult to remove, a high pressure PGMEA spray is used to insure that second buildup dielectric layer 236 is adequately removed to form redistribution pattern terminal apertures 340 and expose redistribution pattern terminals 234.

As illustrated in FIG. 3, redistribution pattern terminal aperture 340 is generally cylindrical, but includes a concave sidewall 341. More particularly, redistribution pattern terminal aperture 340 increases in diameter at redistribution pattern terminal 234 to have a flared base 342.

In one embodiment, due to the high percentage of inorganic filler of second buildup dielectric layer 236, during the UV light exposure, the UV light intensity at redistribution pattern terminal 234 becomes diminished. Accordingly, at redistribution pattern terminal 234, there is less polymerization of second buildup dielectric layer 236 due to less UV exposure. During the high pressure PGMEA spray, this less polymerized region of second buildup dielectric layer 236 at redistribution pattern terminal 234 is removed resulting in flared base 342 for redistribution pattern terminal aperture 340. By performing the PGMEA spray at a high pressure, removal of the less polymerized region of second buildup dielectric layer 236 at redistribution pattern terminal 234 is insured.

The high pressure PGMEWA spray in accordance with one embodiment should be contrasted to a conventional spray of development solution. A conventional spray of development solution is typically performed by spraying the development solution from an aerosol can. As such, with a convention spray of development solution, the development solution is sprayed at a pressure around 40 PSI.

FIG. 4 is a cross-sectional view of assembly 200 of FIG. 3 at a later stage during fabrication in accordance with one embodiment. Referring now to FIGS. 1 and 4 together, from pattern second buildup dielectric layer operation 108, flow moves to a form interconnection balls operation 110. In form interconnection balls operation 110, interconnection balls 442 are formed within redistribution pattern terminal apertures 340 and on redistribution pattern terminals 234.

In one embodiment, to form interconnection balls 442, flux is applied within redistribution pattern terminal apertures 340 and on redistribution pattern terminals 234. Solder balls are dropped onto the flux. The solder balls are then reflowed, i.e., heated to a melt and resolidified, to form interconnection balls 442. The reflow of the solder balls to form interconnection balls 442 is sometimes called a solder ball reflow.

In one particular embodiment, second buildup dielectric layer 236 is cured during the solder ball reflow. The curing of second buildup dielectric layer 236 during the solder ball reflow is sometimes called a reflow cure. Illustratively, the solder ball reflow is performed by heating assembly 200 to 250° C. for one minute. By curing second buildup dielectric layer 236 during the solder ball reflow, the cycle time to fabricate assembly 200 is minimized thus reducing fabrication cost.

As set forth above, in one embodiment, second buildup dielectric layer 236 has a thickness T of 20 μm. By forming second buildup dielectric layer 236 with a 20 μm thickness, second buildup dielectric layer 236 has a sufficient thickness to adequately support, sometimes called brace, interconnection ball 442. This provides a robust bond between interconnection ball 442 and redistribution pattern terminal 234. Further, by forming second buildup dielectric layer 236 with a 20 μm thickness, second buildup dielectric layer 236 is formed sufficiently thin to be formed rapidly and with a minimal usage of dielectric material This improves cycle time and well as minimizes fabrication cost.

FIG. 5 is an enlarged cross-sectional view of the region V of assembly 200 of FIG. 4 in accordance with one embodiment. Referring now to FIGS. 4 and 5 together, interconnection ball 442 has an enclosed, e.g., first, portion 444 and an exposed, e.g., second, portion 446. Enclosed portion 444 is the portion of interconnection ball 442 within second buildup dielectric layer 236. Exposed portion 446 is the portion protruding above and exposed from second buildup dielectric layer 236.

The height H1 of enclosed portion 444 as measured from redistribution pattern 222 is equal to the thickness T of second buildup dielectric layer 236 minus the thickness of redistribution pattern 222. In one particular embodiment, when thickness T of second buildup dielectric layer 236 is 20 μm and the thickness of redistribution pattern 222 is 9 μm, the height H1 of enclosed portion 444 as measured from redistribution pattern 222 is 20 μm minus 9 μm, i.e., 11 μm.

Further, the height H2 of exposed portion 446 is within the range of 150 μm to 180 μm as measured from the exposed upper surface 236U of second buildup dielectric layer 236. Stated another way, height H2 is the height that interconnection ball 442 protrudes above second buildup dielectric layer 236.

Accordingly, the ratio of thickness T of second buildup dielectric layer 236 to height H2 of exposed portion 446 is within the range of 20/180 (0.111) to 20/150 (0.133). Stated another way, thickness T of second buildup dielectric 236 is within the range of 11.1% to 13.3% of the height H2 of exposed portion 446. Generally, thickness T of second buildup dielectric 236 is less than 15% of the height H2 of exposed portion 446.

Enclosed portion 444 is generally cylindrical, but includes an outer concave surface 448. As set forth above, using the high pressure PGMEA spray, redistribution pattern terminal aperture 340 is formed to have a flared base 342 (see FIG. 3). Enclosed portion 444 generally conforms to the shape of redistribution pattern terminal aperture 340 and thus has a protruding lip 449 at redistribution pattern 222.

In accordance with this embodiment, enclosed portion 444 at redistribution pattern 222, i.e., protruding lip 449, has a width W1. The width of enclosed portion 444 gradually decreases as the distance from redistribution pattern 222 increases until a minimum width W2 of enclosed portion 444 is reached. From the minimum width W2, the width of enclosed portion 444 gradually increase as the distance from redistribution pattern 222 increases. The width of enclosed portion 444 is measured in a plane parallel to active surfaces 208 of electronic components 204.

By forming enclosed portion 444 with outer concave surface 448, the angle α of intersection between outer concave surface 448 of interconnection ball 442 and redistribution pattern 222 is less than 90° such that enclosed portion 444 has outwardly protruding lip 449 at redistribution pattern 222. This minimizes stress between interconnection ball 442 and redistribution pattern 222 which, in turn, minimizes failure of the bond between interconnection ball 442 and redistribution pattern 222. In this manner, reliability in the bond between interconnection ball 442 and redistribution pattern 222 is maximized.

Exposed portion 446 is generally spherical in shape. Accordingly, interconnection ball 442 is generally shaped as a ball, e.g., exposed portion 446, on a cylinder, e.g., enclosed portion 444.

Referring again to FIGS. 1 and 4 together, from form interconnection balls operation 110, flow moves to a singulate operation 112. In singulate operation 112, assembly 200 is singulated by cutting along singulation streets 206 to form a plurality of electronic component packages 450. Electronic component packages 450 are sometimes called Wafer Level Chip Scale Packages.

In one embodiment, assembly 200 is singulated by mechanically sawing assembly 200, although can be singulated using other singulation techniques, e.g., a laser. More particularly, assembly 200 is cut through second buildup dielectric layer 236, first buildup dielectric layer 218, passivation layer 214 and wafer 202. By forming second buildup dielectric layer 236 over singulation streets 206, second buildup dielectric layer 236 protects assembly 200 during singulation. More particularly, second buildup dielectric layer 236 provides a crack stop to prevent cracking of electronic component packages 450 during singulation. Accordingly, second buildup dielectric layer 236 maximizes singulation yield of electronic component packages 450.

In another embodiment, during pattern second buildup dielectric layer operation 108, second buildup dielectric layer 236 is removed from singulation streets 206. In accordance with this embodiment, second buildup dielectric layer 236 is not cut during singulate operation 112.

In one embodiment, instead of being formed of polyimide (PI) or polybenzoxazole (PBO), first buildup dielectric layer 218 is formed of a dielectric material identical or similar to the dielectric material of second buildup dielectric layer 236 as described above. In one specific embodiment, first buildup dielectric layer 218 has the properties as listed in Table 1 including an elongation of 100% and a cure temperature of 150-200° C.

After singulate operation 112, the individual electronic component package 450 is physically and electrically connected to a larger substrate, e.g., a printed circuit motherboard. More particularly, interconnection balls 442 are reflowed to physically and electrically connect interconnection balls 442, and thus electronic component package 450, to terminals of the larger substrate.

By having height H2 of exposed portion 446 within the range of 150 μm to 180 μm, a robust bond between interconnection balls 442 and the terminals of the larger substrate is formed. In one specific embodiment, height H2 of exposed portion 446 is 180 μm, but after reflow to mount electronic component package 450 to the larger substrate, height H2 is collapsed to 150 μm. However, as the separation between the larger substrate and second buildup dielectric layer 236 is 150 μm, which is a relatively large separation, thermal stress between the larger substrate and electronic component package is distributed over the 150 μm distance of exposed portion 446. Distributing the thermal stress over this long exposed portion 446 minimizes failure of interconnection ball 442.

Thus, in accordance with one embodiment, an underfill between the larger substrate and electronic component package 450 is unnecessary and not formed. Accordingly, an empty space between the larger substrate and second buildup dielectric layer 236 exists.

For similar reasons, an encapsulation over electronic component package 450 is unnecessary and not formed. Accordingly, inactive surface 210 is exposed directly to the ambient environment.

By not forming an underfill and/or an encapsulation, fabrication cost of the final assembly is minimized.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component package comprising:
   a ReDistribution Line (RDL) pattern comprising a redistribution pattern terminal;
   a buildup dielectric layer coupled to the RDL pattern, the buildup dielectric layer comprising a redistribution pattern terminal aperture exposing the redistribution pattern terminal; and
   an interconnection ball within the redistribution pattern terminal aperture and coupled to the redistribution pattern terminal, the interconnection ball comprising an enclosed portion within the buildup dielectric layer, the enclosed portion comprising an outer concave surface, wherein the enclosed portion is cylindrical.

2. The electronic component package of claim 1 wherein an angle of intersection between the outer concave surface of the interconnection ball and the redistribution pattern is less than 90°.

3. The electronic component package of claim 1 wherein the interconnection ball further comprises an exposed portion exposed from the buildup dielectric layer.

4. The electronic component package of claim 3 wherein the exposed portion is spherical.

5. The electronic component package of claim 1 wherein the buildup dielectric layer comprises a dielectric material having an elongation of 100% and a cure temperature of 150-200° C.

6. The electronic component package of claim 1 further comprising:
   an electronic component comprising an active surface; and
   a first buildup dielectric layer coupled to the active surface, the buildup dielectric layer being a second buildup layer that is an entirely different layer than the first buildup dielectric layer, the first buildup dielectric layer comprising a dielectric material having an elongation of 100% and a cure temperature of 150-200° C., the RDL pattern being coupled to the first buildup dielectric.

7. The electronic component package of claim 6 wherein the second buildup dielectric layer has a thickness within the range of 15 microns (μm) to 40 μm.

8. The electronic component package of claim 7 wherein the thickness of the second buildup dielectric layer is 20 μm.

9. The electronic component package of claim 6 further comprising a bond pad coupled to the active surface, the first buildup dielectric layer comprising a first buildup dielectric layer bond pad aperture exposing the bond pad, wherein the RDL pattern is coupled to the bond pad through the first buildup dielectric layer bond pad aperture.

10. An electronic component package comprising:
    a ReDistribution Line (RDL) pattern comprising a redistribution pattern terminal;
    a buildup dielectric layer coupled to the RDL pattern, the buildup dielectric layer comprising a redistribution pattern terminal aperture exposing the redistribution pattern terminal; and
    an interconnection ball within the redistribution pattern terminal aperture and coupled to the redistribution pattern terminal, the interconnection ball comprising a cylindrical enclosed portion within the buildup dielectric layer, the enclosed portion comprising a protruding lip at the RDL pattern.

11. The electronic component package of claim 10 wherein the RDL pattern comprises:
    a first RDL layer;
    a second RDL layer coupled to the first RDL layer; and
    a third RDL layer coupled to the second RDL layer.

12. The electronic component package of claim 10 wherein the RDL pattern has a thickness of 9 microns (μm) and has a uniform thickness.

13. The electronic component package of claim 10 wherein a thickness of the buildup dielectric layer is less than 15% of a height that the interconnection ball protrudes above the buildup dielectric layer.

14. The electronic component package of claim 13 wherein the thickness of the buildup dielectric layer is 20 μm and the height that the interconnection ball protrudes above the buildup dielectric layer is within the range of 150 μm to 180 μm.

15. A method of forming an electronic component package comprising:
    forming a ReDistribution Line (RDL) pattern comprising a redistribution pattern terminal;
    applying a buildup dielectric layer to the RDL pattern; and
    patterning the buildup dielectric layer to form a redistribution pattern terminal aperture exposing the redistribution pattern terminal, the patterning comprises spraying the buildup dielectric layer with a buildup dielectric layer removal fluid at a pressure within the range of 100 pounds per square inch (PSI) to 1000 PSI.

16. The method of claim 15 wherein the pressure is 300 PSI.

17. The method of claim 15 wherein the buildup dielectric layer removal fluid comprises Propylene Glycol Methyl Ether Acetate (PGMEA).

18. The method of claim 15 wherein a wafer comprises singulation streets, the applying a buildup dielectric layer comprising applying the buildup dielectric layer to the singulation streets, the method further comprising:
    singulating the wafer and the buildup dielectric layer along the singulation streets.

19. The method of claim 15 further comprising:
    performing a solder ball reflow to form an interconnection ball within the redistribution pattern terminal aperture and coupled to the redistribution pattern terminal, wherein the buildup dielectric layer is cured during the solder ball reflow.

20. The method of claim 19 wherein the solder ball reflow comprises heating the electronic component package to 250° C. for one minute.

21. The method of claim 19 wherein the interconnection ball comprises an enclosed portion within the buildup dielectric layer, the enclosed portion comprising an outer concave surface.

22. The method of claim 19 wherein the interconnection ball comprises a protruding lip at the RDL pattern.

23. The method of claim 19 wherein a thickness of the buildup dielectric layer is less than 15% of a height that the interconnection ball protrudes above the buildup dielectric layer.

24. An electronic component package comprising:
    a ReDistribution Line (RDL) pattern comprising a redistribution pattern terminal;
    a buildup dielectric layer coupled to the RDL pattern, the buildup dielectric layer comprising a dielectric material having an elongation of 100% and a cure temperature of 150-200° C., the buildup dielectric layer comprising a redistribution pattern terminal aperture exposing the redistribution pattern terminal; and
    an interconnection ball within the redistribution pattern terminal aperture and coupled to the redistribution pattern terminal, wherein a thickness of the buildup dielectric layer is less than 15% of a height that the interconnection ball protrudes above the buildup dielectric layer.

25. The electronic component package of claim 24 wherein the thickness of the buildup dielectric layer is 20 μm and the height that the interconnection ball protrudes above the buildup dielectric layer is within the range of 150 μm to 180 μm.

26. An electronic component package comprising:
    a ReDistribution Line (RDL) pattern comprising a redistribution pattern terminal; and
    a buildup dielectric layer coupled to the RDL pattern, the buildup dielectric layer comprising a redistribution pattern terminal aperture exposing the redistribution pattern terminal, the redistribution pattern terminal aperture comprising a cylindrical concave sidewall.

27. The electronic component package of claim 26 wherein the redistribution pattern terminal aperture comprises a flared base at the redistribution pattern terminal.

\* \* \* \* \*